US007462982B2

United States Patent
Choi et al.

(10) Patent No.: US 7,462,982 B2
(45) Date of Patent: *Dec. 9, 2008

(54) FLAT PANEL DISPLAY USING SILICON LIGHT-EMITTING DEVICE

(75) Inventors: Byoung-lyong Choi, Seoul (KR); Eun-kyung Lee, Gyeonggi-do (KR); Jun-young Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 406 days.

This patent is subject to a terminal disclaimer.

(21) Appl. No.: 10/752,560

(22) Filed: Jan. 8, 2004

(65) Prior Publication Data

US 2005/0156152 A1    Jul. 21, 2005

(51) Int. Cl.
*H01L 33/00* (2006.01)
(52) U.S. Cl. .......................... 313/498; 313/502; 257/87
(58) Field of Classification Search ................. 313/498, 313/499, 502; 257/88, 90, 94, 96, 97, 40, 257/100–103, 87
See application file for complete search history.

(56) References Cited

U.S. PATENT DOCUMENTS

| 5,607,876 | A | * | 3/1997 | Biegelsen et al. | ............. | 438/45 |
| 6,049,090 | A | * | 4/2000 | Clark, Jr. | ....................... | 257/13 |
| 6,057,561 | A | * | 5/2000 | Kawasaki et al. | ............. | 257/94 |
| 6,583,446 | B1 | * | 6/2003 | Taninaka et al. | ............. | 257/93 |
| 2003/0127655 | A1 | | 7/2003 | Choi et al. | | |

\* cited by examiner

*Primary Examiner*—Karabi Guharay
(74) *Attorney, Agent, or Firm*—Buchanan Ingersoll & Rooney PC

(57) ABSTRACT

A flat panel display is provided. The flat panel display includes a silicon light-emitting device panel having a two-dimensional array of silicon light-emitting devices formed on an n- or p-type silicon-based substrate, and a fluorescent layer formed on the front surface of the silicon light-emitting device panel and emitting visible light after being excited by light emitted from the silicon light-emitting devices, wherein each of the silicon light-emitting devices comprises: a doping region formed on a surface of the substrate in such a way that the substrate is doped with a predetermined dopant of the opposite type to the substrate to a depth so that recombination of electron-hole pairs by quantum confinement effect at a p-n junction leads to light emission; and electrodes patterned on the substrate to allow the silicon light-emitting devices to emit light according to an image signal. The flat panel display includes the low-priced silicon light-emitting device panel having a two dimensional array of the silicon light-emitting devices formed on the inexpensive silicon-based substrate through series semiconductor manufacture processes. Therefore, the flat panel display can be manufactured at low cost. Furthermore, unlike a plasma display panel, a high voltage or a gas sealing process for discharge is not required, thereby increasing stability and reliability.

15 Claims, 4 Drawing Sheets

Longitudinal QW       Lateral QW

FLAT PANEL DISPLAY USING SILICON LIGHT-EMITTING DEVICE

BACKGROUND OF THE INVENTION

1. Field of the Invention

The present invention relates to a display, and more particularly, to a flat panel display using a silicon light-emitting device.

2. Description of the Related Art

Displays using a cathode ray tube (CRT) have excellent display characteristics, but have a problem of a high increase of the volume level with increasing screen size. In this regard, developments and commercial applications of flat panel displays having a small volume and a large screen have rapidly proceeded.

Plasma display panels (PDPs) are one of promising flat panel displays with a large screen. Since the PDPs have good display characteristics, like the CRTs, such as large display capacity, high luminance, high contrast, and wide viewing angle, attention has been paid to the PDPs as flat panel displays capable of replacing the CRTs.

The PDPs are classified into a direct current (DC) type, an alternative current (AC) type, and a hybrid type according to the structures of electrodes.

While electrodes are directly exposed to plasma in DC-type PDPs, electrodes are indirectly exposed to plasma through a dielectric layer in AC-type PDPs.

FIG. 1 is an exploded perspective view of an example of conventional AC-type PDPs.

Referring to FIG. 1, a PDP comprises a rear substrate 6, address electrodes 7 formed to a predetermined pattern on the rear substrate 6, and a first dielectric layer 5 formed on the rear substrate 6 to cover the address electrodes 7.

The address electrodes 7 have a predetermined width and are formed in a stripe pattern parallel to each other.

When the rear substrate 6 is sealed together with a transparent front substrate 1 using a sealing material (not shown) in a state where the two substrates are separated from each other by about 0.1 mm gap, a discharge space is defined between the two substrates. A plurality of sustain electrodes consisting of a pair of a first electrode 2a and a second electrode 2b that are perpendicular to the address electrodes 7 are formed on an inner surface of the front substrate 1. The first and second electrodes 2a and 2b are made of a transparent material. Bus electrodes 2c are formed to a narrow width on the first and second electrodes 2a and 2b to decrease line resistance.

Intersection of the address electrodes 7 and the first and second electrodes 2a and 2b creates an effective display area.

A second dielectric layer 4 is formed on an inner surface of the front substrate 1 to cover the first and second electrodes 2a and 2b. Partition walls 8 are formed between the rear substrate 6 and the front substrate 1 to separate discharge cells. The second dielectric layer 4 has a protection film 3 made of MgO on a surface thereof to discharge secondary electrons. Fluorescent layers 9 are formed in the discharge cells separated by the partition walls 8.

The discharge cells are filled with a discharge gas such as a mixture of neon (Ne) gas, xenon (Xe) gas, and argon (Ar) gas.

When a predetermined pulse voltage is applied to the address electrodes 7 and one electrode of the first and second electrodes 2a and 2b in a PDP as described above, address discharge occurs, which leads to generation of wall charge on the inner surfaces of the discharge cells. The generated wall charge is collected on the surfaces of the discharge cells. In this state, when the same voltage is applied to the other electrode of the first and second electrodes 2a and 2b, the discharge of the discharge gas occurs between the first and second electrodes 2a and 2b, thereby generating ultraviolet light. The generated ultraviolet light excites the fluorescent substance of the fluorescent layers, which leads to visible light emission.

However, the PDP as described above has problems in that various constitutional elements and processes for gas charge and electric discharge are necessary, the structure and manufacture process of the PDP are complicated, and a production cost is high. In addition, high power consumption is necessary, image diffusion occurs, thereby lowering resolution, and a response time is slow.

SUMMARY OF THE INVENTION

Therefore, the present invention has been made in view of the above problems of plasma display panels. The present invention provides a low-priced flat panel display comprising a silicon light-emitting device panel having a two-dimensional array of silicon light-emitting devices formed on an inexpensive silicon-based substrate using series semiconductor manufacture processes.

According to an aspect of the present invention, there is provided a flat panel display comprising a silicon light-emitting device panel having a two-dimensional array of silicon light-emitting devices formed on an n- or p-type silicon-based substrate and comprising a fluorescent layer formed on the front surface of the silicon light-emitting device panel and emitting visible light after being excited by light emitted from the silicon light-emitting devices, wherein each of the silicon light-emitting devices comprises: a doping region formed on a surface of the substrate in such a way that the substrate is doped with a predetermined dopant of the opposite type to the substrate to a depth so that recombination of electron-hole pairs by quantum confinement effect at a p-n junction leads to light emission; and electrodes patterned on the substrate to allow the silicon light-emitting devices to emit light according to an image signal.

The silicon light-emitting devices may emit ultraviolet light, and the fluorescent layer may be made of a material emitting visible light after being excited by the ultraviolet light emitted from the silicon light-emitting devices.

The silicon light-emitting device panel may be formed in such a manner that one of the silicon light-emitting devices corresponds to one pixel.

In this case, the fluorescent layer may be formed to be patterned fluorescents of three types or more per one pixel to emit different visible light after being excited by light emitted from one of the silicon light-emitting devices per one pixel.

The silicon light-emitting device panel may be formed in such a manner that three or more of the silicon light-emitting devices correspond to one pixel.

In this case, the fluorescent layer may be formed to be patterned fluorescents of three types or more per one pixel to emit different visible light after being excited by light emitted from three or more of the silicon light-emitting devices per one pixel.

Each of the silicon light-emitting devices may further comprise a control film, which serve as a mask in the formation of the doping region to form the doping region to an ultra-shallow depth.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
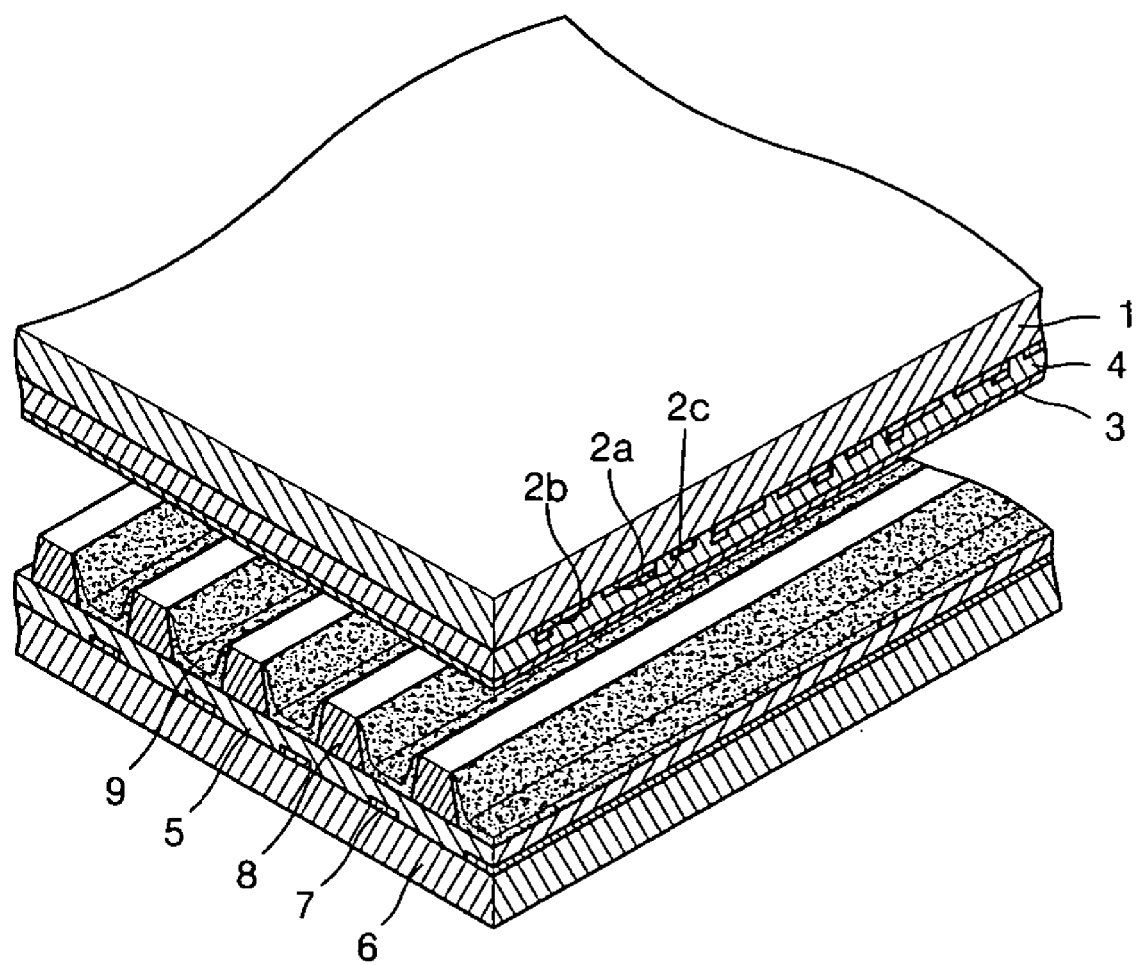
FIG. 1 is a schematic perspective view of a conventional alternative current type plasma display panel.
Figure 2:
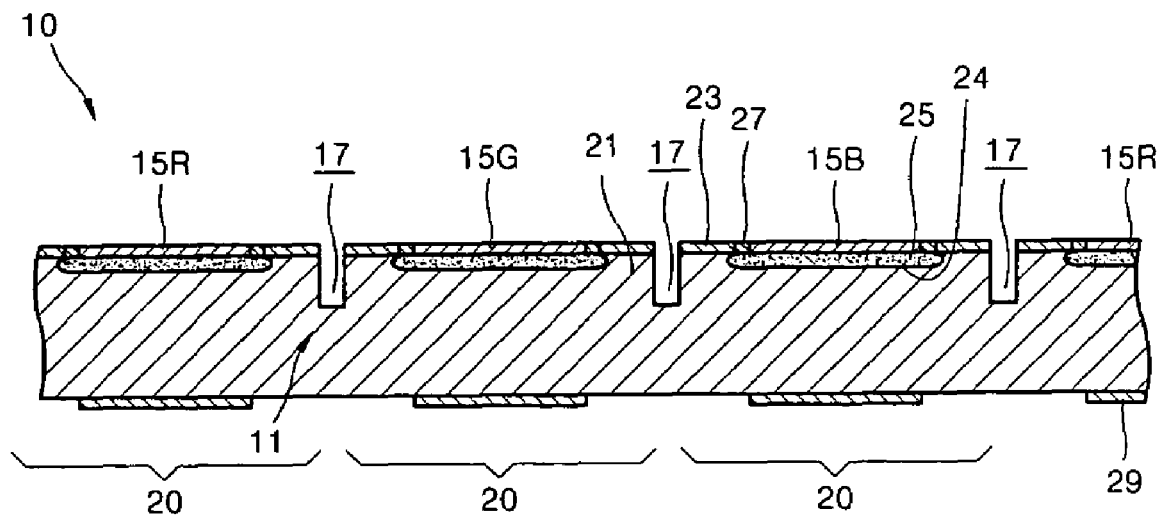
FIG. 2 is a schematic sectional view of a flat panel display according to a first embodiment of the present invention.
Figure 3:
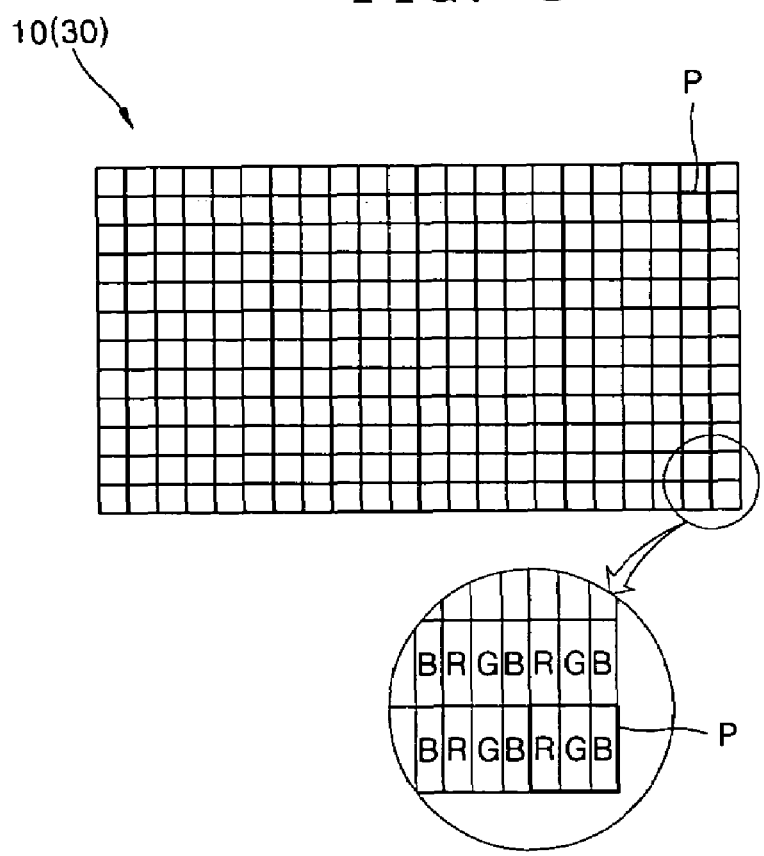
FIG. 3 is a schematic plan view of a pixel structure of a flat panel display that can display a full-color image according to the present invention.

FIG. 2 is a schematic sectional view of a flat panel display 10 according to a first embodiment of the present invention and FIG. 3 is a schematic plan view of a pixel structure of a flat panel display that can display a full-color image according to the present invention.

Referring to FIGS. 2 and 3, the flat panel display 10 according to the first embodiment of the present invention comprises a silicon light-emitting device panel 11 having a two-dimensional array of silicon light-emitting devices 20 formed on an n- or p-type silicon-based substrate 21, and fluorescent layers 15R, 15G, and 15B formed on the front surface of the silicon light-emitting device panel 11 and emitting visible light after being excited by light emitted from the silicon light-emitting devices. In FIG. 2, a reference numeral 17 denotes a trench formed to a predetermined depth by etching to provide electrical insulation between adjacent two of the silicon light-emitting devices 20. The trench may be filled with an insulating material.

In FIG. 3, P represents a pixel. In the first embodiment of the present invention, three silicon light-emitting devices 20 for forming a red image R, a green image G, and a blue image B correspond to one pixel P. In FIG. 3, R, G, and B represent areas intended for formation of red, green, and blue images, respectively. All of the R, G, and B areas is present in each pixel. According to a color display manner, three or more silicon light-emitting devices or one silicon light-emitting device may correspond to each pixel P.

Figure 4:
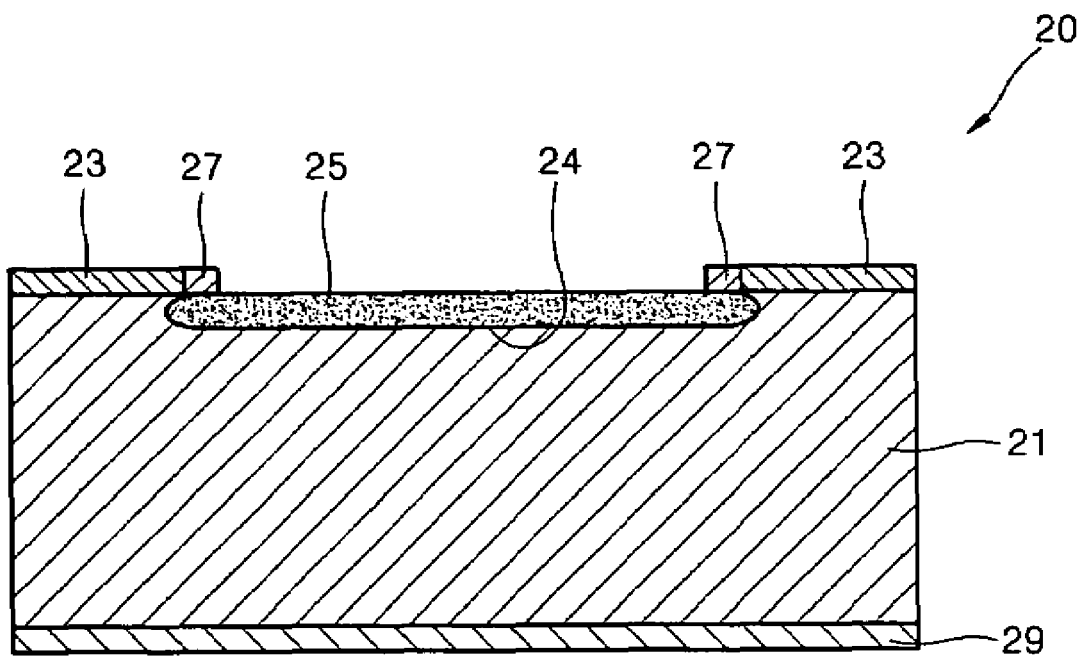
FIG. 4 is a sectional view of one silicon light-emitting device in a silicon light-emitting device panel of FIG. 2.

FIG. 4 is a sectional view of one silicon light-emitting device 20 in the silicon light-emitting device panel 11 of FIG. 2.

The silicon light-emitting device 20 comprises a doping region 25 that is ultra-shallowly formed in a surface of the substrate 21, for example, to a depth of 50 nm or less, using a predetermined dopant of the opposite type to the substrate 21, as shown in FIG. 4. The doping region is formed so that recombination of electron-hole pairs by quantum confinement effect at a p-n junction 24 between the substrate 21 and the doping region 25 leads to light emission.

At the p-n junction 24 of the silicon light-emitting device 20, in addition to the recombination of electron-hole pairs, the creation of electron-hole pairs may occur. Accordingly, the silicon light-emitting device 20 can perform reception of light.

The silicon light-emitting device 20 will now be described in detail.

The silicon light-emitting device 20 comprises the doping region 25 formed in a surface of an n-type silicon-based substrate 21 (for example) and first and second electrodes 27 and 29 formed on both surfaces of the substrate 21 to be electrically connected to the doping region 25, as shown in FIG. 4. Preferably, the silicon light-emitting device 20 further comprises a control film 23 serving as a mask in the formation of the doping region 25. The control film 23 is formed on the surface of the substrate 21 to allow the doping region 25 to be formed to a desired ultra-shallow depth. The control film 23 may be removed after the formation of the doping region 25. FIGS. 2 and 4 show an example of the presentation of the control film formed on the silicon light-emitting device panel 11.

The substrate 21 is used as a base of the silicon light-emitting device panel 11 in a flat panel display according to the present invention. The substrate 21 is a silicon-based semiconductor substrate made of a silicon (Si)-containing predetermined semiconductor material, for example, Si, SiC, or diamond and is doped to an n- or p-type.

The doping region 25 may be doped to the opposite type to the substrate 21, for example, a p+ type, by non-equilibrium diffusion of a predetermined dopant such as boron and phosphorus into the substrate 21 through openings of the control film 23.

Preferably, the doping region 25 is formed to an ultra-shallow depth, for example, to a depth of 50 nm or less. Therefore, a quantum structure comprised of at least one of quantum wells, quantum dots, and quantum wires is formed at an interface between the doping region 25 and substrate 21, i.e., at the p-n junction 24. As a result, the quantum confinement effect occurs, thereby leading to the photoelectric conversion effect for high quantum efficiency, i.e., the recombination of electron-hole pairs.

Here, quantum wells are mainly formed at the p-n junction 24. Quantum dots or quantum wires may also be formed. A composite structure comprised of two or more types of quantum wells, quantum dots, and quantum wires may also be formed at the p-n junction 24. Hereinafter, for the sake of simplicity, a quantum structure formed at the p-n junction 24 will be described only in terms of quantum wells. However, the expression, "the quantum wells formed at the p-n junction 24", or similar expressions indicate at least one of quantum wells, quantum dots, and quantum wires.

Figure 5A:
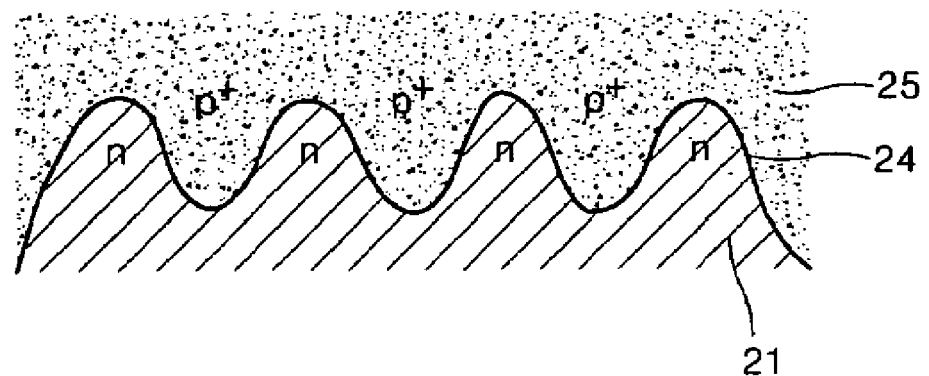
FIG. 5A is a schematic view of a p-n junction formed when a doping region is formed to an ultra-shallow depth by a non-equilibrium diffusion process.
Figure 5B:
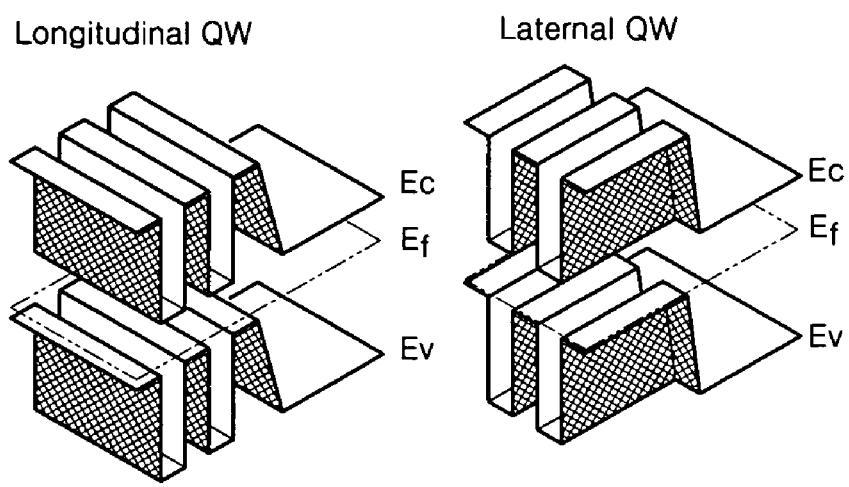
FIG. 5B is a view of energy bands of longitudinal quantum wells (QWs) and lateral QWs at the p-n junction of FIG. 5A.

FIG. 5A is a schematic view of the p-n junction 24 formed when the doping region 25 is formed to an ultra-shallow depth by a non-equilibrium diffusion process. FIG. 5B is a view of energy bands of longitudinal quantum wells (QWs) and lateral QWs at the p-n junction 24 of FIG. 5A. In FIG. 5B, Ec represents a conduction band energy level, Ev represents a valence band energy level, and Ef represents a Fermi energy level. Since these energy levels have been well disclosed in the semiconductor-related technology fields, the detailed descriptions thereof will be omitted.

As shown in FIGS. 5A and 5B, the p-n junction 24 has the quantum well structure such that doping portions of opposite conductivity types alternate with each other. Here, wells and barriers are about 2 and 3 nm width, respectively.

Such ultra-shallow doping for forming quantum wells at the p-n junction 24 can be accomplished by optimally controlling the thickness of the control film 23 and the conditions of a diffusion process.

The thickness of a diffusion profile can be adjusted to an 10-20 nm (for example) by an appropriate diffusion temperature and a deformed potential of the surface of the substrate 31 during a diffusion process. The quantum well structure is created by the ultra-shallow diffusion profile thus formed. Here, the surface potential of the substrate 31 is transformed depending on initial thickness of the control film 23 and surface pre-treatment. The surface potential increases as the diffusion process proceeds.

Preferably, the control film 23 is a silicon oxide ($SiO_2$) film with an appropriate thickness so that doping region 25 is formed to an ultra-shallow doping depth. For example, the control film 23 can be patterned in such a way that a $SiO_2$ film is formed on a surface of the substrate 31 and then etched by a photolithography process to form openings for a diffusion process. The control film thus patterned has a mask structure due to the openings.

As well known in the field of the diffusion technology, when a silicon oxide film is formed to a thickness larger than an appropriate thickness (e.g. several thousand Angstroms) or a diffusion temperature is low, vacancies mainly affect diffusion, thereby causing a deep diffusion. On the other hand, when a silicon oxide film is formed to a thickness smaller than an appropriate thickness or the diffusion temperature is high, silicon self-interstitials mainly affect diffusion, thereby causing a deep diffusion.

Diffusion mechanism is largely divided into kick-out mechanism by self-interstitials and vacancy mechanism by vacancies. A silicon oxide film serves as a source for silicon self-interstitials that affect the diffusion.

When the thickness of a silicon oxide film is thin, the kick-out mechanism by the self-interstitials mainly induces diffusion. On the other hand, when it is thick, the quantity of the self-interstitials is small, and thus, the vacancy mechanism mainly induces diffusion. In both cases, when the effect of any one of the self-interstitials and the vacancies is great, deep diffusion occurs.

However, when a silicon oxide film is formed to an appropriate thickness, the silicon self-interstitials and the vacancies are generated at a similar ratio. It is possible because the vacancies are filled with the self-interstitials. That is, diffusion occurs very slightly.

Therefore, when a silicon oxide film is formed to an appropriate thickness in which the silicon self-interstitials and the vacancies are generated at a similar ratio, combination of the silicon self-interstitials and the vacancies retards dopant diffusion. As a result, an ultra-shallow doping is accomplished.

Meanwhile, since a silicon oxide film serves as a source for the silicon self-interstitials that affect diffusion, the self-interstitials can sufficiently move to side areas, in addition to underlying areas. In this regard, there is no need to form a silicon oxide film directly under a diffusion region.

Therefore, it is possible to form the doping region 25 through the openings of the control film 23 by a non-equilibrium diffusion process.

The physical properties of the vacancies and self-interstitials as used herein are well disclosed in the field of the diffusion technology, and thus, the detailed descriptions thereof will be omitted.

If the substrate 31 is doped to a p type, the doping region 25 is doped to an n+ type.

The first electrode 27 is formed at the same surface of the substrate as at which the doping region 25 is formed and the second electrode 29 is formed on the opposite surface of the substrate 21. FIGS. 2 and 4 show that the first electrode 27 made of an opaque metal is formed in such a way to be in contact with external sides of the doping region 25. The first electrode 27 may also be made of a transparent electrode material such as indium tin oxide (ITO). In this case, the first electrode 27 may be formed on the whole surface of the doping region 25.

The first and second electrodes 27 and 29 are appropriately patterned on the substrate 21 as a base of the silicon light-emitting device panel 11 of the flat panel display 10 according to the first embodiment of the present invention. Therefore, appropriate light is emitted according to an image signal on a pixel-by-pixel basis in the silicon light-emitting device panel 11, thereby leading to two-dimensional display of an image.

The silicon light-emitting device 20 has quantum wells at the p-n junction 24 between the doping region 25 and the substrate 21 at which recombination of electron and hole pairs occurs. Accordingly, light emission as describe above is possible.

That is, the silicon light-emitting device 20 emits light as follows. For example, when an electric power for light emission is applied across the first and second electrodes 27 and 29, carriers, i.e., electrons and holes, are injected into the quantum wells of the p-n junction 24 and recombined (annihilated) through a subband energy level of the quantum wells. In this case, electro luminescence (EL) occurs at predetermined wavelengths according to the recombination state of carriers, and the quantity of light emitted varies depending on the magnitude of the electric power (voltage or current) applied.

The silicon light-emitting device panel 11 can comprise a two-dimensional array of the silicon light-emitting devices 20 in such a way that three of the silicon light-emitting devices 20 correspond to one pixel. Therefore, the three silicon light-emitting devices 20 on a pixel-by-pixel basis emit an appropriate quantity of light to display a color image by red, green, and/or blue images R, G, and/or B or combination thereof according to an image signal applied across the first and second electrodes 27 and 29.

In this case, a light emission wavelength at the silicon light-emitting devices 20 is determined by micro-cavities caused by micro-defects formed on the surface of the substrate 21 (specifically, on the surface of the doping region 25). In this regard, the silicon light-emitting devices 20 with the desired ranges of light emission wavelength can be obtained by adjusting the sizes of micro-cavities during fabrication of the doping region 25.

Here, the intensity of electro luminescence (EL) can be amplified when the light emission wavelength range of the silicon light-emitting devices 20 match well with the resonance wavelength of micro-cavities caused by micro-defects formed on the surface of substrate 21.

Therefore, by adjusting the sizes of micro-cavities during fabrication of the doping region 25, the silicon light-emitting devices 20 can emit light of a wavelength range capable of exciting the fluorescent layers 15R, 15G, and 15B, preferably, ultraviolet light.

Here, micro-cavities are caused by a deformed potential due to micro-defects formed on the surface of the doping region 25. In this regard, adjustment of the deformed potential enables the deformation of quantum wells, and thus, the sizes of micro-cavities are adjusted. Therefore, by adjusting the sizes of micro-cavities, light of a desired wavelength can be emitted.

As described above, the silicon light-emitting devices 20 having the ultra-shallow doping region 25 has high quantum efficiency since the quantum confinement effect occurs due to local variations in potential of charge distribution at the p-n junction 24 and a subband energy level is set in the quantum wells.

The silicon light-emitting devices serving as light-emitting devices are disclosed in detail in U.S. patent application Ser. No. 10/122,421, titled "silicon optoelectronic device and light-emitting apparatus using the same", filed by the same applicant. The disclosure of this application is incorporated herein by reference. Therefore, the detailed description of the silicon light-emitting devices 20 will be omitted herein.

The silicon light-emitting device panel 11 comprises a two-dimensional array of the silicon light-emitting devices 20 formed on the silicon-based substrate 21 through series semiconductor manufacture processes in such a way that three of the silicon light-emitting devices 20 correspond to one pixel.

The silicon light-emitting device panel 11 as described above can be manufactured using the inexpensive silicon-based substrate 21 through series semiconductor manufacture processes, thereby decreasing a production cost. Therefore, a low-priced flat panel display can be obtained.

A flat panel display according to the present invention may comprise one silicon light-emitting device panel 11 formed on one silicon-based substrate 21 or combination of a plurality of silicon light-emitting device panels 11 according to a desired screen size.

Referring again to FIGS. 2 and 3, in the silicon light-emitting device panel 11 comprising a two-dimensional array of the silicon-light emitting devices 20 formed on the silicon-based substrate 21, the first and second electrodes 27 and 29 and the fluorescent layers 15R, 15G, and 15B are patterned on the silicon-based substrate 21 so that light is emitted according to an image signal on a pixel-by-pixel basis.

The fluorescent layers 15R, 15G, and 15B are formed on the front surface of the silicon light-emitting device panel 11 including a window region (the upper surface of the doping region surrounded by the first electrodes) at which the output of light emitted from the silicon light-emitting devices 20 occurs. Therefore, the fluorescent layers 15R, 15G, and 15B emit visible light after being excited by light emitted from the silicon light-emitting devices 20. That is, the fluorescent layers 15R, 15G, and 15B are formed so that red, green, and blue images R, G, and B are displayed on the window regions of the silicon light-emitting devices 20, i.e., on the doping regions 25 surrounded by the first electrodes 27.

In a flat panel display according to the first embodiment of the present invention, three of the silicon light-emitting devices 20 correspond to one pixel P. Therefore, it is preferable to form three types of the fluorescent layers 15R, 15G, and 15B corresponding to the number of the silicon light-emitting devices 20 per one pixel. That is, in this embodiment of the present invention, each pixel P comprises three silicon light-emitting devices 20 and three fluorescent layers 15R, 15G, and 15B. The three fluorescent layers 15R, 15G, and 15B emit respectively red, green, and blue light on the window regions of the silicon light-emitting devices 20, i.e., on the doping regions 25 surrounded by the first electrodes 27 after being excited by light emitted from the silicon light-emitting devices 20.

Figure 6:
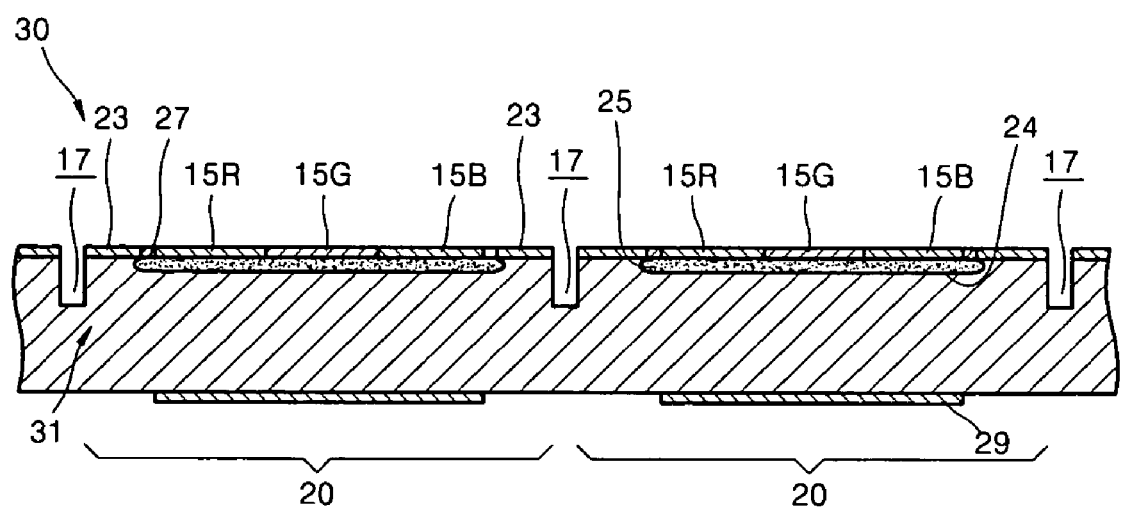
FIG. 6 is a schematic view of a flat panel display according to a second embodiment of the present invention.

FIG. 6 is a schematic sectional view of a flat panel display 30 according to a second embodiment of the present invention. The flat panel display 30 comprises a silicon light-emitting device panel 31 having one silicon light-emitting device 20 per one pixel P. Preferably, three types of fluorescent layers 15R, 15G, and 15B are patterned so that red, green, and blue light are emitted on the window region of the one silicon light-emitting device 20 corresponding to one pixel P. In FIG. 6, the same reference numerals as in FIG. 2 indicate the substantially same constitutional elements in terms of the functions and materials used. Therefore, the overlapped descriptions of the constitutional elements will be omitted.

In this case, one silicon light-emitting device 20 is used to display red, green, and blue images R, G, and B per one pixel P. Therefore, in order to display a full-color image, the red, green, and blue images R, G, and B must be orderly displayed. That is, during one frame for display of a full-color image, each of the red, green, and blue images R, G, and B must be displayed during a ⅓ frame.

As described above, according to the embodiments of the present invention, the three types of the fluorescent layers 15R, 15G, and 15B emit different visible light, for example, red, green, and blue light per each pixel P. Therefore, the flat panel displays 10 and 30 comprising the fluorescent layers 15R, 15G, and 15B can display red, green, and blue images R, G, and B, i.e., a full-color image.

A flat panel display according to the present invention can also display a monochromic (black and white) image in a case where one of the silicon light-emitting devices 20 corresponds to one pixel P and the fluorescent layers of the same material are positioned on the window regions of the silicon light-emitting devices 20 that are formed to a two-dimensional array in the silicon light-emitting device panel 11.

Meanwhile, in a flat panel display of the present invention, it is preferable that the silicon light-emitting devices 20 emit ultraviolet light, as generated by electric discharge in a plasma display panel (PDP) and the fluorescent layers 15R, 15G, and 15B use a fluorescent material as used in a PDP.

In this case, in developments of a flat panel display according to the present invention capable of replacing a PDP, burden on the development of fluorescent materials for the fluorescent layers 15R, 15G, and 15B is reduced.

An yttrium, gadolinium-based fluorescent material is mainly used as a red fluorescent material in a PDP. An example of the yttrium, gadolinium-based fluorescent material is $(Y, Gd)BO_3:Eu$.

A zinc silicate-based fluorescent material is mainly used as a green fluorescent material in a PDP. An example of the zinc silicate-based fluorescent material is manganese-activated zinc orthosilicate, $Zn_2SiO_4:Mn$.

A barium aluminate-based fluorescent material is mainly used as a blue fluorescent material in a PDP. Examples of the barium aluminate-based blue fluorescent material include $BaMgAl_{10}O_{17}:Eu^{+2}$, $BaMgAl_{14}O_{23}:Eu^{+2}$, and $BaMgAl_{16}O_{27}:Eu^{+2}$. Among them, the $BaMgAl_{10}O_{17}:Eu^{+2}$ is mainly used.

These red, green, and blue fluorescent materials used in a PDP can be used for the fluorescent layers 15R, 15G, and 15B of a flat panel display according to the present invention.

In this regard, in a case where the silicon light-emitting devices 20 of a flat panel display of the present invention comprise the fluorescent layers 15R, 15G, and 15B made of the above-described materials for ultraviolet emission, the production cost of the silicon light-emitting device panel 11 may be reduced. In addition, burden on the development of fluorescent materials for the fluorescent layers 15R, 15G, and 15B decreases. Thus, the production cost for a flat panel display of the present invention can be greatly lowered.

A flat panel display according to the present invention may further comprise a protection film (not shown) made of a transparent material, for example, a glass material or a transparent acrylic material that can transmit visible light emitted from the fluorescent layers 15R, 15G, and 15B to protect all of the fluorescent layers 15R, 15G, and 15B and the silicon light-emitting device panel 11. The protection film may be a transparent substrate made of a glass or a transparent acrylic material that can transmit visible light. Preferably, the transparent substrate is coupled on the front surface of the silicon light-emitting device panel 11 on which the fluorescent layers 15R, 15G, and 15B are formed for image display.

As is apparent from the above description, a flat panel display according to the present invention comprises a low-priced silicon light-emitting device panel having a two dimensional array of silicon light-emitting devices formed on an inexpensive silicon-based substrate through series semiconductor manufacture processes. Therefore, the flat panel display can be manufactured at low cost. Furthermore, unlike a PDP, a high voltage or a gas sealing process for discharge is not required, thereby increasing stability and reliability.

Silicon light-emitting devices used in a flat panel display of the present invention can emit ultraviolet light. Therefore, fluorescent materials used in a conventional PDP can be used for fluorescent layers, thereby decreasing burden on the development of a new fluorescent material. Accordingly, a low-priced flat panel display can be produced.

Silicon light-emitting devices have very high ultraviolet light efficiency. Therefore, a flat panel display of the present invention is much more efficient than a PDP.

In addition, since a flat panel display of the present invention displays an image by driving silicon light-emitting devices that are semiconductor devices. Therefore, power consumption can be considerably decreased and a response time is very fast, relative to a PDP. Also, since silicon light-emitting devices are controlled to emit light on a pixel-by-pixel basis, the lowering of resolution by image diffusion like in a PDP can be decreased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display comprising
a silicon light-emitting device panel having at least two-dimensional array of silicon light-emitting devices formed on an n- or p-type silicon-based substrate; and
a fluorescent layer formed on the front surface of the silicon light-emitting device panel and emitting visible light after being excited by light emitted from the silicon light-emitting devices; and
electrodes patterned on the substrate to allow the silicon light-emitting devices to emit light according to an image signal;
wherein each of the silicon light-emitting devices comprises a doped region formed on a surface of the substrate and doped to a depth of a predetermined dopant to be an opposite type from that of the substrate such that a photoelectrical conversion effect by quantum confinement occurs in a plurality of deformed areas, wherein said plurality of deformed areas constitute an undulated pattern.

2. The flat panel display according to claim 1, wherein the silicon light-emitting devices emit ultraviolet light, and the fluorescent layer is made of a material emitting visible light after being excited by the ultraviolet light emitted from the silicon-emitting devices.

3. The flat panel display according to claim 2, wherein the silicon light-emitting device panel is formed in such a manner that one of the silicon light-emitting devices corresponds to one pixel.

4. The flat panel display according to claim 3, wherein the fluorescent layer is formed to be patterned fluorescents of three types or more per one pixel to emit different visible light after being excited by light emitted from one of the silicon light-emitting devices per one pixel.

5. The flat panel display according to claim 2, wherein the silicon light-emitting device panel is formed in such a manner that three or more of the silicon light-emitting devices correspond to one pixel.

6. The flat panel display according to claim 5, wherein the fluorescent layer is formed to be patterned fluorescents of three types or more per one pixel to emit different visible light after being excited by light emitted from three or more of the silicon light-emitting devices per one pixel.

7. The flat panel display according to claim 2, wherein each of the silicon light-emitting devices further comprises a control film, which serves as a mask in the formation of the doping region to form the doping region to an ultra-shallow depth.

8. The flat panel display according to claim 1, wherein the silicon light-emitting device panel is formed in such a manner that one of the silicon light-emitting devices corresponds to one pixel.

9. The flat panel display according to claim 8, wherein the fluorescent layer is formed to be patterned fluorescents of three types or more per one pixel to emit different visible light after being excited by light emitted from one of the silicon light-emitting devices per one pixel.

10. The flat panel display according to claim 1, wherein the silicon light-emitting device panel is formed in such a manner that three or more of the silicon light-emitting devices correspond to one pixel.

11. The flat panel display according to claim 10, wherein the fluorescent layer is formed to be patterned fluorescents of three types or more per one pixel to emit different visible light after being excited by light emitted from three or more of the silicon light-emitting devices per one pixel.

12. The flat panel display according to claim 1, wherein each of the silicon light-emitting devices further comprises a control film, which serves as a mask in the formation of the doping region to form the doping region to an ultra-shallow depth.

13. The flat panel display according to claim 1, wherein the doped region is formed at an ultra-shallow depth in the substrate.

14. The flat panel display according to claim 1, wherein a pair of first electrodes of the electrodes are connected to opposite ends of the doped region.

15. The flat panel display according to claim 1, wherein the electrodes are patterned on a surface of the doped region.

* * * * *